United States Patent
Kye et al.

(10) Patent No.: US 6,399,401 B1
(45) Date of Patent: Jun. 4, 2002

(54) TEST STRUCTURES FOR ELECTRICAL LINEWIDTH MEASUREMENT AND PROCESSES FOR THEIR FORMATION

(75) Inventors: Jongwook Kye, Pleasanton; Harry Levinson, Saratoga, both of CA (US)

(73) Assignee: Advanced Micro Devices, In., Sunnyvale, CA (US)

( * ) Notice: Subject to any disclaimer, the term of this patent is extended or adjusted under 35 U.S.C. 154(b) by 0 days.

(21) Appl. No.: 09/912,186

(22) Filed: Jul. 24, 2001

(51) Int. Cl.$^7$ .............................................. G01R 31/26
(52) U.S. Cl. ........................................... 438/17; 257/48
(58) Field of Search ............................. 257/48; 438/17, 438/14–16, 18; 29/593; 324/716

(56) References Cited

U.S. PATENT DOCUMENTS

| | | |
|---|---|---|
| 5,485,080 A | 1/1996 | Larabee et al. |
| 5,552,718 A | 9/1996 | Bruce et al. |
| 5,797,114 A | 8/1998 | Roberts et al. |
| 5,834,795 A | * 11/1998 | Lee .............................. 257/48 |
| 5,857,258 A | 1/1999 | Penzes et al. |
| 5,963,784 A | 10/1999 | Bothra et al. |
| 6,087,189 A | 7/2000 | Huang |
| 6,127,197 A | 10/2000 | Kim et al. |

OTHER PUBLICATIONS

Andrew Grenville et al., *Electrical Critical Dimension Metrology for 100–nm Linewidths and Below*, SPIE Proceedings, vol. 4000, pp. 452–459 (2000).
Bin Yu et al., *Gate Engineering for Deep–Submicron CMOS Transistors*, IEEE Transactions on Electron Devices, vol. 45, No. 6 (Jun. 1998).

* cited by examiner

Primary Examiner—Charles Bowers
Assistant Examiner—Craig Thompson
(74) Attorney, Agent, or Firm—Foley & Lardner

(57) ABSTRACT

In a method of determining a linewidth of a polysilicon line formed by a lithographic process, a polysilicon layer is formed on a substrate. A line is patterned from said polysilicon layer using said lithographic process and a Van der Pauw structure is patterned from said polysilicon layer. $N_2$ is then implanted into the polysilicon line and the polysilicon Van der Pauw structure to form a depletion barrier. A P-type dopant is the implanted into the polysilicon line and the polysilicon Van der Pauw structure and the dopant is activated. A sheet resistivity of the Van der Pauw structure is determined, and the linewidth of the polysilicon line is then determined by electrical linewidth measurement using the sheet resistivity of the Van der Pauw structure as the sheet resistivity of the polysilicon line. A related test structure is also disclosed.

20 Claims, 4 Drawing Sheets

Linewidth test structure

Patterning of a polysilicon line of a test structure

Implantation of N₂ as a depletion barrier in the polysilicon line of the test structure Implantation of P-type dopant in the polysilicon line of the test structure

TEST STRUCTURES FOR ELECTRICAL LINEWIDTH MEASUREMENT AND PROCESSES FOR THEIR FORMATION

FIELD OF THE INVENTION

The invention pertains to measurement of linewidths in semiconductor devices, and particularly to techniques that improve linewidth measurements made by electrical linewidth measurement (ELM) techniques.

BACKGROUND OF THE INVENTION

Integrated circuits (ICs) are manufactured by forming discrete semiconductor devices such as MOSFETS and bipolar junction transistors on the surface of a silicon wafer, and then creating conductive lines that connect the devices to create circuits. A variety of materials may be used to form the lines, including metals, doped polysilicon, and silicon/metal alloys, also known as silicides. Presently, doped polysilicon (referred to hereinafter as polysilicon) is gaff the preferred line material.

Integrated circuit elements and connecting lines are typically formed by projection lithography processes. In general, projection lithography is a process whereby a pattern to be formed on a substrate is projected onto a photosensitive coating (hereinafter photoresist) applied to the substrate, thereby exposing the photoresist to the pattern. Subsequent development processes remove either the exposed portion of the photoresist or the unexposed portion, leaving behind a photoresist structure (hereinafter mask) in the shape of either the projected pattern or a negative image of the projected pattern. The photoresist mask is then utilized as a barrier in further processing steps. For example, the photoresist mask may protect portions of the substrate from being etched away in an etching process, or may protect portions of the substrate from being implanted with dopant during an implantation process.

The size and location of structures formed through projection lithography techniques are affected by many variables. As a result, it is necessary to test structures produced by lithography to determine whether their actual dimensions and positions coincide with the intended dimensions and positions.

One feature for which dimensional testing is critical is the physical linewidth of polysilicon lines. As the critical dimensions of semiconductor devices become smaller, linewidths become correspondingly small, and thus are more easily subjected to error. Present MOSFET technology providing gate lengths of 0.13 µm utilizes corresponding physical linewidths of between 50 nm and 80 nm.

The most accurate tool for determining physical linewidth is the scanning electron microscope (SEM). However, the accuracy provided by the SEM varies depending on the orientation of the SEM. The side walls of a line typically have a rough and sloping profile. If the SEM is used in a vertical orientation to provide a cross-sectional view of the line, the width of the line at each point along its height is measured and one of those points, e.g. the uppermost point, can be chosen as representing the actual physical linewidth. In contrast, if the SEM is used in a top-down orientation to provide a top view, it is difficult to determine where within the slope of the line side walls the measurement is being made. Thus, an SEM measurement made in a top-down orientation will typically indicate that the line is wider than it actually is. In both cases, the SEM method is expensive and time consuming, and therefore is not appropriate for production environments.

Another method for determining physical linewidth is through electrical linewidth measurement (ELM). Unlike the SEM methods, ELM linewidth measurement provides relatively rapid results along with good reliability, and is therefore more desirable for production environments. However, as the name implies, electrical linewidth measurement measures the "electrical width" of the line rather than its physical width. The difference between actual physical linewidth and the electrical linewidth measured by ELM, referred to hereinafter as the offset, is typically in the range of 50 nm–100 nm. For prior generation technology, an offset of 100 nm was not significant in relation to the typical physical linewidth, and therefore ELM was employed for linewidth measurement in prior generation production environments despite the fact that its results did not precisely represent the physical linewidths of the measured lines. However, as next generation linewidths approach and exceed the value of the conventional offset, the ELM offset becomes significant and renders the technique unusable.

The ELM method determines the electrical width of a conducting structure based on sheet resistivity. FIG. 1 shows an example of a linewidth test structure produced for ELM. The structure includes two test cells 10 and 12. The first cell 10 includes a Van der Pauw structure 14 formed of polysilicon, and four polysilicon contact pads 18, 20, 22 and 24 that are connected to the four corners of the Van der Pauw structure 14. The second test cell 12 includes a polysilicon line 16 having a known length L and a linewidth width W that is to be determined by testing. The second test cell 12 further includes four polysilicon contact pads 22, 24, 26 and 28 that are connected to the line 16.

The Van der Pauw structure 14, the polysilicon line 16 and the contact pads are formed at the same time and thus have the same material composition. The first test cell 10 of the test structure is used to determine the sheet resistivity $\sigma$ of the polysilicon Van der Pauw structure 14 using the well-known Van der Pauw method. The sheet resistivity $\sigma$ is determined from the resistance $R_V$ of the Van der Pauw structure measured using the four contact pads of the first cell, and is given by the relationship $\sigma = R_V \pi / \ln 2$. The linewidth W of the polysilicon line 16 is then determined by applying a constant current to the line 16 and measuring the voltage drop across the known length L of the line using the four contact pads of the second cell to determine the resistance $R_L$ of the line. The linewidth is given by the relationship $W = \sigma L / R_L$.

The offset between actual physical linewidth and linewidth measured by ELM is believed to be caused by dopant depletion within the polysilicon line. More particularly, during annealing of the polysilicon line to active implanted dopant, a portion of the dopant near the surfaces of the line is out-diffused, resulting in depletion of dopant within the line and formation of depletion regions near the surfaces of the line. Thus the average sheet resistivity for the line as a whole is greater than the sheet resistivity value used in the electrical linewidth determination, and so the electrical linewidth determined by ELM is different than the physical linewidth.

Proposals for addressing the ELM offset problem have been put forth by Grenville et al. in their article "Electrical Critical Dimension Metrology for 100-nm Linewidths and Below," published in *Optical Lithography XIII*, Proceedings of SPIE Vol. 4000 (2000) ("Grenville"). Grenville proposes four solutions for reducing out-diffusion of dopant. First, Grenville proposes the use of P-type dopant for providing conductivity in polysilicon, because P-type dopant experiences less out-diffusion during annealing. Second, Grenville proposes lowering the annealing temperature to reduce out-diffusion. Third, Grenville proposes formation of a silicon nitride cap over the polysilicon before annealing to trap dopant within the polysilicon. Fourth, Grenville proposes reducing the thickness of the polysilicon line. Through a combination of these techniques, Grenville has lowered the ELM offset of an experimental polysilicon line from 90 nm to 20 nm. However, Grenville's techniques entail disadvantages that are undesirable in the production environment. For example, lowering the annealing temperature results in reduced activation of dopant, and consequently results in higher polysilicon resistance, the effects of which become detrimental to the ELM method as linewidth decreases. The additional fabrication steps involved in depositing and subsequently removing a silicon nitride cap add further cost and complexity to the fabrication process.

Consequently, there remains a need for a solution to the ELM offset problem that is easily applied in the production environment without adding significant additional processing steps to the conventional polysilicon line formation process.

SUMMARY OF THE INVENTION

Embodiments of the invention address the foregoing shortcomings of the conventional technology by providing a method for forming a test structure for determining polysilicon linewidth by ELM measurement that significantly reduces the ELM offset in comparison to conventional test structures. In accordance with embodiments of the invention, a test structure is formed by patterning a polysilicon line and implanting and activating a P-type dopant. However, prior to implanting the dopant, the polysilicon line is implanted with $N_2$. The $N_2$ treatment significantly reduces out-diffusion of dopant during annealing. Accordingly, less depletion occurs and the linewidth measurement obtained by ELM has a much smaller offset with respect to actual physical linewidth than in conventional technology.

Embodiments of the invention pertain to a method of determining a linewidth of a polysilicon line formed by a lithographic process. A polysilicon layer is formed on a substrate. A line is patterned from said polysilicon layer using said lithographic process and a Van der Pauw structure is patterned from said polysilicon layer. $N_2$ is then implanted into the polysilicon line and the polysilicon Van der Pauw structure to form a depletion barrier. A P-type dopant is the implanted into the polysilicon line and the polysilicon Van der Pauw structure and the dopant is activated. A sheet resistivity of the Van der Pauw structure is determined, and the linewidth of the polysilicon line is then determined by electrical linewidth measurement using the sheet resistivity of the Van der Pauw structure as the sheet resistivity of the polysilicon line. In further embodiments, the dose of $N_2$ may be determined in accordance with an expected linewidth and an acceptable offset.

Further embodiments of the invention pertain to a test structure for electrical linewidth measurement of a linewidth of a polysilicon line formed by a lithographic process. The test structure comprises a polysilicon Van der Pauw structure and a polysilicon line patterned using said lithographic process. The test structure also comprises a plurality of contacts electrically connected to the Van der Pauw structure, and pairs of contacts electrically connected at respective first and second points of the polysilicon line to define a known length L of polysilicon line therebetween. The polysilicon Van der Pauw structure and the polysilicon line comprise a P-type dopant and implanted $N_2$ that serves as a depletion barrier against out-diffusion of the P-type dopant.

BRIEF DESCRIPTION OF THE DRAWINGS

Various preferred embodiments are hereafter described with reference to the accompanying drawings, wherein like numerals denote like elements, and in which.

DETAILED DESCRIPTION OF PREFERRED EMBODIMENTS

Figure 2:
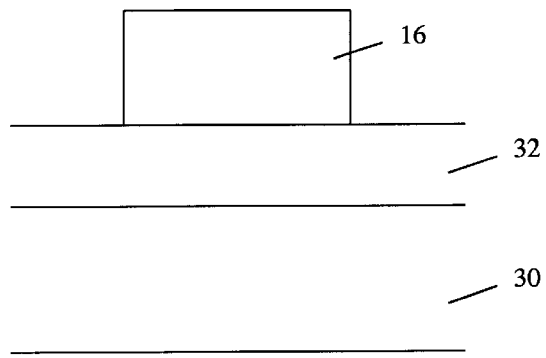
FIG. 2 shows a patterned polysilicon line of a linewidth test structure in accordance with an embodiment of the invention.
Figure 3:
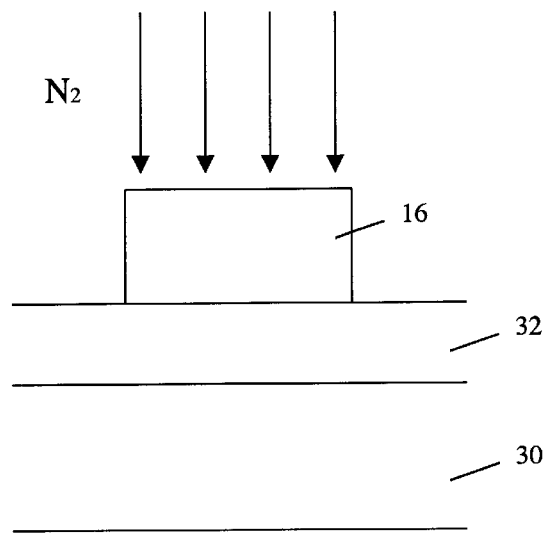
FIG. 3 shows implantation of a nitrogen depletion barrier in a patterned polysilicon line of a linewidth test structure in accordance with an embodiment of the invention.
Figure 4:
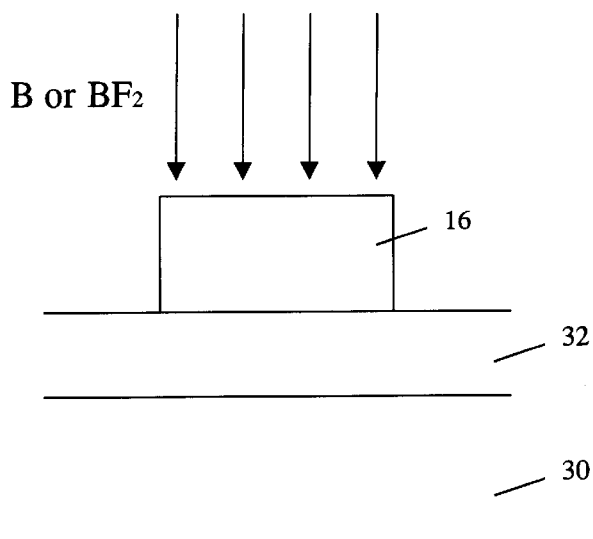
FIG. 4 shows implantation of a P-type dopant in a patterned polysilicon line of a linewidth test structure in accordance with an embodiment of the invention.

FIGS. 2–4 show structures formed during processing in accordance with a preferred embodiment of the invention to produce a linewidth test structure for testing a patterned doped polysilicon line by electrical linewidth measurement.

In FIG. 2, a patterned polysilicon line 16 of a test structure is disposed on a substrate comprising a protective oxide layer 32 that overlies a silicon layer 30. The line 16 is patterned according to a lithographic line formation process that is to be tested to determine the actual linewidth produced by the process. In a preferred embodiment the polysilicon line has a thickness of 1000–2000 Å. The test structure may be formed in a test region of a silicon wafer also having semiconductor devices formed thereon, or the test structure may be formed separately on a substrate having no other structure formed thereon.

In addition to the polysilicon line 16, there are formed on the substrate a Van der Pauw structure (not shown) and contact pads. The polysilicon line 16, the Van der Pauw structure and the contact pads are patterned from the same layer of polysilicon and, apart from being pattered to have different shapes, are subjected to the same processing conditions. Accordingly, the polysilicon line 16 and the Van der Pauw structure are formed of essentially identical thicknesses of essentially identical material, enabling a resistivity determined from the Van der Pauw structure to be used in evaluating the linewidth of the polysilicon line 16 using electrical linewidth measurement.

FIG. 3 shows implantation of the polysilicon line 16 with $N_2$. The Van der Pauw structure and contact pads are simultaneously implanted with $N_2$. In the preferred embodiment of the invention, $N_2$ is implanted at a dose of $1\times10^{15}$ $cm^{-2}$ to $1\times10^{16}$ $cm^{-2}$ and at an energy of 40 KeV. The structure is then annealed to diffuse the $N_2$ so as to have a substantially uniform distribution.

FIG. 4 shows implantation of the polysilicon line 16 with a P-type dopant such as B or $BF_2$. The Van der Pauw structure and contact pads are simultaneously implanted with the P-type dopant. The P-type dopant is implanted using typical dopant processing parameters. In the preferred embodiment of the invention, B is implanted at a dose in the range of $1\times10^{14}$ to $1\times10^{15}$ $cm^{-2}$ and at an energy of 5 KeV.

Of course, other doses may be utilized. Alternatively, $BF_2$ may be implanted, for example at a dose in the range of $1\times10^{14}$ cm$^{-2}$ to $2\times10^{15}$ cm$^{-2}$ and at an energy of 40 KeV.

Figure 5:
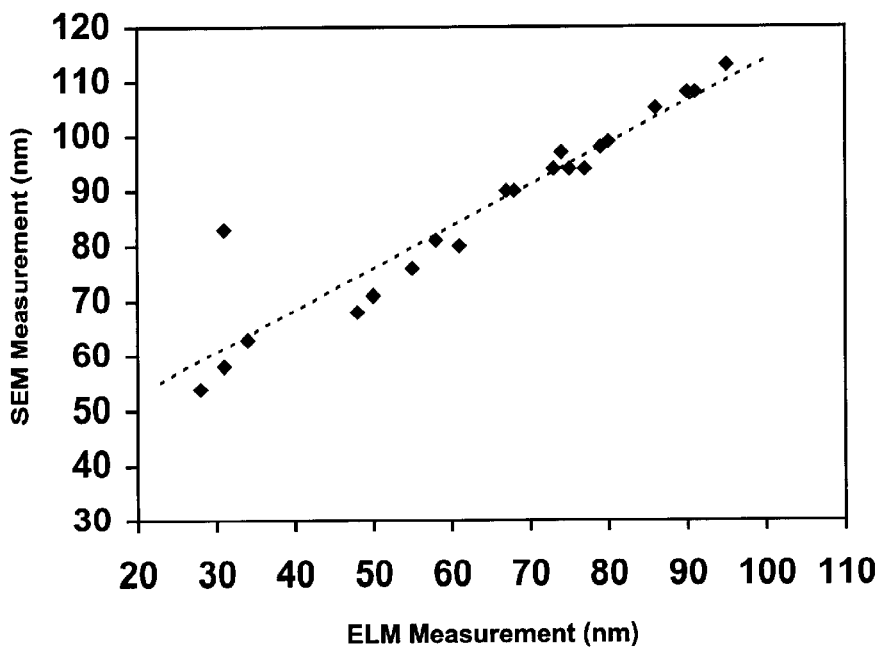
FIG. 5 shows a graph representing ELM offset measurement data for ELM measurements of test structures formed in accordance with the preferred embodiment of the invention.

A graph representing ELM offset measurement data for ELM measurements of test structures formed in accordance with the preferred embodiment of the invention is shown in FIG. 5. Each data point of FIG. 5 represents a linewidth measurement made by ELM, and a corresponding top-down SEM measurement, for lines of various widths formed in various test structures. The data of FIG. 5 demonstrate a linear relationship representing an average offset of approximately 27.5 nm between each ELM measurement and its corresponding SEM measurement. Because the SEM measurement used to generate these data was previously determined to have a positive offset relative to actual physical line width of 12.5 nm determined using a conventional vertical SEM measurement, the average offset of each ELM measurement to actual physical linewidth is approximately 15 nm. Thus, fabrication of test structures in accordance with the preferred embodiment enables the use of ELM for linewidth determination for lines as small as 35 nm or less.

After implantation of P-type dopant, the polysilicon line 16 and Van der Pauw structure are annealed to activate the P-type dopant. It is preferred to use rapid thermal annealing (RTA) in order to further minimize dopant diffusion. The annealing is carried out at a conventional temperature. In the preferred embodiment of the invention, annealing is carried out at a temperature of 900–1100 deg. C. During annealing the implanted $N_2$ serves as a depletion barrier that reduces out-diffusion of the P-type dopant, and consequently the extent of any depletion region formed through out-diffusion is significantly reduced as compared to the conventional technology. Thus an ELM linewidth measurement performed on the polysilicon line 16 is significantly more accurate than for a similar line formed using conventional technology.

Figure 1:
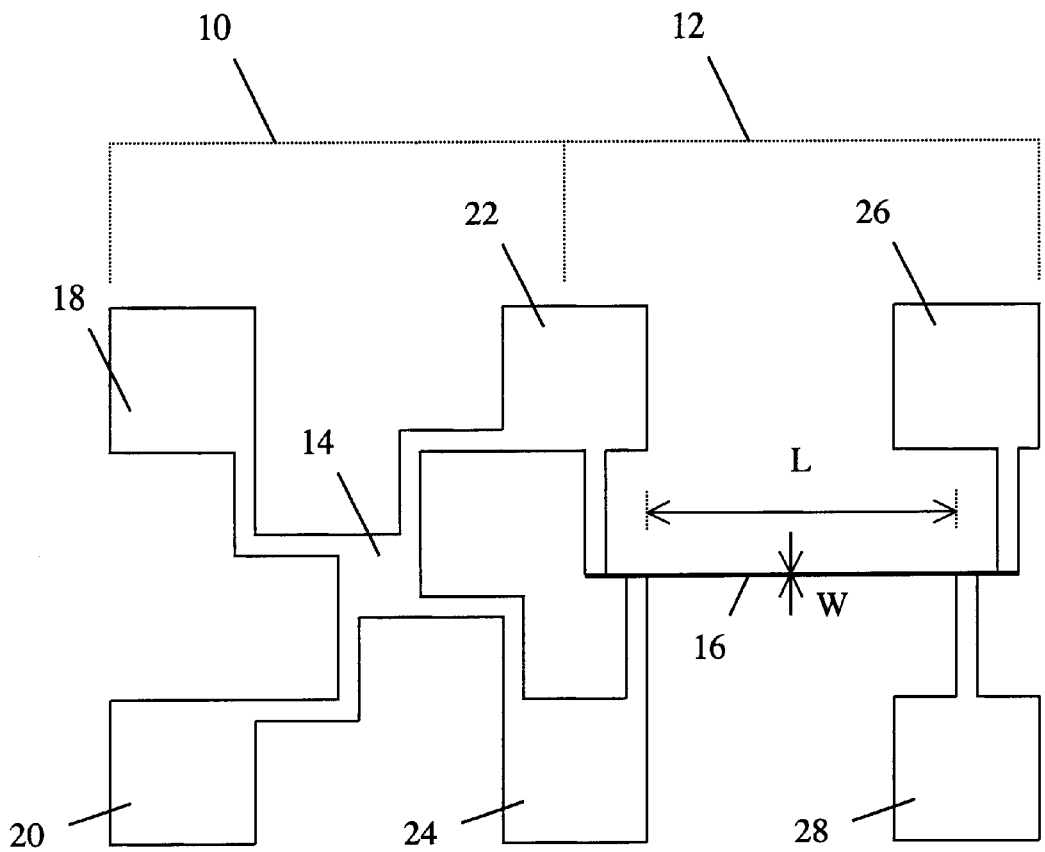
FIG. 1 shows a conventional linewidth test structure.

In the preferred embodiment of the invention, the contact pads are formed in a configuration as shown in FIG. 1. However, a variety of other configurations, such as those disclosed by Grenville, and those disclosed in U.S. Pat. No. 6,087,189, are known in the conventional technology and may be employed as alternatives to the configuration of the preferred embodiment. In preferred configurations, four contact pads are arranged such that two contact pads are in contact with each of the opposing ends of a known length of the polysilicon line 16, such as shown in FIG. 1.

Figure 6:
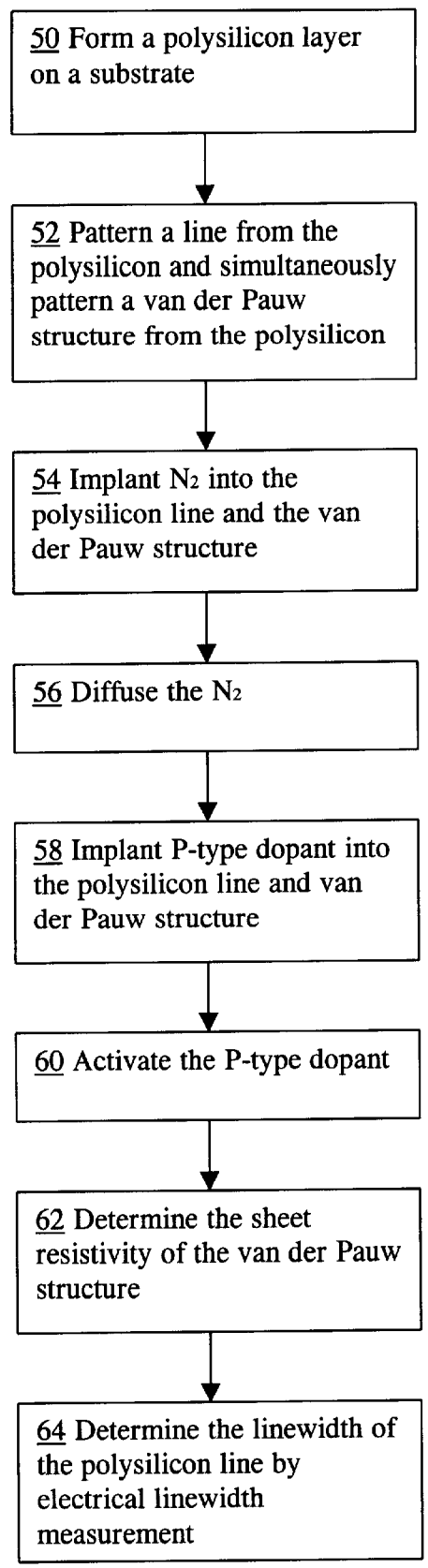
FIG. 6 shows a process for forming a test structure in accordance with embodiments of the invention.

A process for determining a linewidth of a polysilicon line formed by a lithographic process in accordance with embodiments of the invention is illustrated in FIG. 6. Initially a polysilicon layer is formed (50) on a substrate. The polysilicon preferably has a thickness of 1000–2000 Å. The substrate typically comprises a protective thermal oxide formed over monocrystalline silicon but may alternatively comprise other types of substrates. Subsequently a polysilicon line is patterned (52) from the polysilicon layer using the lithographic process that is to be tested. A Van der Pauw structure is simultaneously patterned from the polysilicon layer. $N_2$ is then implanted (54) into the polysilicon line and the Van der Pauw structure. The $N_2$ is preferably implanted at a dose of $1\times10^{15}$ cm$^{-2}$ to $1\times10^{16}$ cm$^{-2}$ and at an energy of 40 KeV for polysilicon having a thickness of 10000–2000 Å. The $N_2$ is then diffused (56), such as by annealing. A P-type dopant is then implanted (58) into the polysilicon line and the Van der Pauw structure. The P-type dopant is preferably B implanted at a dose in the range of $1\times10^{14}$ to $1\times10^{15}$ cm$^{-2}$ and at an energy of 5 KeV. The P-type dopant is subsequently activated (60), preferably at a temperature of 900–1100 deg. C. using RTA.

The foregoing processing tasks result in the formation of a test structure. Subsequently, a sheet resistivity of the Van der Pauw structure is determined (62). The linewidth of the polysilicon line is then determined (64) by electrical linewidth measurement using the sheet resistivity of the Van der Pauw structure as the sheet resistivity of the polysilicon line.

As described above, the foregoing process may further include forming contacts in electrical connection with the Van der Pauw structure, and forming contacts in electrical connection with the polysilicon line to define a known length L of the line between the contacts.

While the preferred embodiments of the invention have been illustrated and described, those skilled in the art will recognize various changes and modifications that may be made to yield alternative embodiments, for example, by substituting equivalent materials, structures or processing tasks for those disclosed herein, by employing additional materials, structures or processing tasks, or by adaptation to a particular situation. Therefore a variety of embodiments in addition to those disclosed herein are encompassed by the appended claims.

What is claimed is:

1. A method of determining a linewidth of a polysilicon line formed by a lithographic process, comprising:
   forming a polysilicon layer on a substrate;
   patterning a line from said polysilicon layer using said lithographic process and simultaneously patterning a Van der Pauw structure from said polysilicon layer;
   implanting $N_2$ into said polysilicon line and said polysilicon Van der Pauw structure to form a depletion barrier;
   implanting a P-type dopant into said polysilicon line and said polysilicon Van der Pauw structure;
   activating the P-type dopant;
   determining a sheet resistivity of the Van der Pauw structure; and
   determining a linewidth of said polysilicon line by electrical linewidth measurement using the sheet resistivity of the Van der Pauw structure as the sheet resistivity of the polysilicon line.

2. The method claimed in claim 1, wherein said linewidth determined by electrical linewidth measurement has an offset with respect to an actual physical linewidth of said polysilicon line of less than 20 nm.

3. The method claimed in claim 1, wherein said $N_2$ is implanted at a dose of $1\times10^{15}$ cm$^{-2}$ to $1\times10^{16}$ cm$^{-2}$ and at an energy of 40 KeV.

4. The method claimed in claim 1, wherein said P-type dopant is B implanted at a dose in the range of $1\times10^{14}$ to $1\times10^{15}$ cm$^{-2}$ and at an energy of approximately 5 KeV.

5. The method claimed in claim 1, wherein said P-type dopant is $BF_2$ implanted at a dose in the range of $1\times10^{14}$ to $2\times10^{15}$ cm$^{-2}$ and at an energy of approximately 40 KeV.

6. The method claimed in claim 1, wherein said P-type dopant is activated by rapid thermal annealing at a temperature of 900–1100 deg. C.

7. The method claimed in claim 1, wherein said $N_2$ is diffused after being implanted.

8. The method claimed in claim 1, wherein contacts are formed simultaneously with said Van der Pauw structure and said polysilicon line.

9. The method claimed in claim 1, further comprising forming contacts electrically connected to said polysilicon line at points defining a known length L of said polysilicon line.

10. A test structure for electrical linewidth measurement of a linewidth of a polysilicon line formed by a lithographic process, comprising:

a polysilicon Van der Pauw structure;

a polysilicon line patterned using said lithographic process;

a plurality of contacts electrically connected to said Van der Pauw structure; and a pair of contacts electrically connected at respective first and second points of the polysilicon line to define a known length L of polysilicon line therebetween;

wherein said polysilicon Van der Pauw structure and said polysilicon line comprise a P-type dopant and $N_2$ serving as a depletion barrier against out-diffusion of the P-type dopant.

11. The test structure claimed in claim 10, wherein said van der Pauw structure and polysilicon line comprise $N_2$ implanted at a dose of $1\times10^{15}$ cm$^{-2}$ to $1\times10^{16}$ cm$^{-2}$ and at an energy of 40 KeV.

12. The test structure claimed in claim 10, wherein said P-type dopant is $BF_2$ implanted at a dose in the range of $1\times10^{14}$ to $2\times10^{15}$ cm$^{-2}$ and at an energy of approximately 40 KeV.

13. The test structure claimed in claim 10, wherein said P-type dopant is B implanted at a dose in the range of $1\times10^{14}$ to $1\times10^{15}$ cm$^{-2}$ and at an energy of approximately 5 KeV.

14. The test structure claimed in claim 10, wherein said P-type dopant is activated by rapid thermal annealing at a temperature of 900–1100 deg. C.

15. The test structure claimed in claim 10, wherein said $N_2$ has a substantially uniform distribution.

16. A method of forming a test structure for determining a linewidth of a polysilicon line by electrical linewidth measurement, comprising:

forming a polysilicon layer on a substrate;

patterning a line from said polysilicon layer using said lithographic process and simultaneously patterning a Van der Pauw structure from said polysilicon layer;

implanting $N_2$ into said polysilicon line and said polysilicon Van der Pauw structure to form a depletion barrier;

implanting a P-type dopant into said polysilicon line and said polysilicon Van der Pauw structure; and activating the P-type dopant.

17. The method claimed in claim 16, wherein said $N_2$ is implanted at a dose of $1\times10^{15}$ cm$^{-2}$ to $1\times10^{16}$ cm$^{-2}$ and at an energy of 40 KeV.

18. The method claimed in claim 16, wherein said P-type dopant is B implanted at a dose in the range of $1\times10^{14}$ to $1\times10^{15}$ cm$^{-2}$ and at an energy of approximately 5 KeV.

19. The method claimed in claim 16, wherein said P-type dopant is $BF_2$ implanted at a dose in the range of $1\times10^{14}$ to $2\times10^{15}$ cm$^{-2}$ and at an energy of approximately 40 KeV.

20. The method claimed in claim 16, wherein said $N_2$ is diffused after being implanted.

* * * * *